United States Patent
Asaka et al.

(10) Patent No.: US 9,912,116 B2
(45) Date of Patent: Mar. 6, 2018

(54) BURST OPTICAL SIGNAL TRANSMISSION DEVICE AND BURST OPTICAL SIGNAL TRANSMISSION METHOD

(71) Applicant: NIPPON TELEGRAPH AND TELEPHONE CORPORATION, Tokyo (JP)

(72) Inventors: Kota Asaka, Yokosuka (JP); Katsuhisa Taguchi, Yokosuka (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 0 days.

(21) Appl. No.: 15/519,170

(22) PCT Filed: Oct. 26, 2015

(86) PCT No.: PCT/JP2015/080091
§ 371 (c)(1),
(2) Date: Apr. 14, 2017

(87) PCT Pub. No.: WO2016/068070
PCT Pub. Date: May 6, 2016

(65) Prior Publication Data
US 2017/0237232 A1   Aug. 17, 2017

(30) Foreign Application Priority Data
Oct. 29, 2014   (JP) ................ 2014-220100

(51) Int. Cl.
*H01S 5/042*     (2006.01)
*H04B 10/50*    (2013.01)

(52) U.S. Cl.
CPC ........... *H01S 5/042* (2013.01); *H04B 10/503* (2013.01)

(58) Field of Classification Search
CPC ............................. H01S 5/042; H04B 10/503
See application file for complete search history.

(56) References Cited

U.S. PATENT DOCUMENTS

2012/0301151 A1* 11/2012 Hu ................. H04B 10/40
                                                                 398/135
2013/0016745 A1*  1/2013 Moto ............... H01S 5/0265
                                                                 372/29.011
(Continued)

FOREIGN PATENT DOCUMENTS

WO      2014/208529 A1   12/2014

OTHER PUBLICATIONS

Notification of Transmittal of the International Preliminary Report on Patentability dated May 11, 2017 from corresponding PCT Application No. PCT/JP2015/080091, 6 pages.
(Continued)

Primary Examiner — Xinning Niu
(74) *Attorney, Agent, or Firm* — Ohlandt, Greeley, Ruggiero & Perle, L.L.P.

(57) ABSTRACT

A burst optical signal transmission device which includes a light source for generating and outputting burst signal light, a light source driving circuit for outputting, to the light source, a driving signal for switching between an output time and a stop time of the burst signal light, based on a burst control signal, and a pre-emphasis circuit for outputting a pre-emphasis control signal for superimposing an additional signal for charging a capacitor included in the light source, onto the driving signal, at a timing in the vicinity of the beginning of the burst control signal.

13 Claims, 13 Drawing Sheets

(56) References Cited

U.S. PATENT DOCUMENTS

2014/0339918 A1* 11/2014 Perreault .................. H01G 4/38
307/109
2016/0127045 A1 5/2016 Asaka et al.

OTHER PUBLICATIONS

Kimura, S., "WDM/TDM-PON Technologies for Future Flexible Optical Access Networks", OECC2010 Technical Digest, Jul. 2010, pp. 14-15, 15th vol., Sapporo Convention Center, Japan.
International Search Report dated Dec. 8, 2015 from corresponding PCT Application No. PCT/JP2015/080091, 3 pages.

* cited by examiner

BURST OPTICAL SIGNAL TRANSMISSION DEVICE AND BURST OPTICAL SIGNAL TRANSMISSION METHOD

TECHNICAL FIELD

The present invention relates to a burst optical signal transmission device for transmitting a burst optical signal, and a control method for the same.

BACKGROUND ART

In recent years, along with the rapid popularization of the Internet, the capacity enlargement, more advanced functions, and economization of an optical access system have been demanded. As a method for realizing such a system, the research of a passive optical network (PON) has been advanced. The PON is an optical access communication system advantageous for economization because it can share a transmission path between an equipment at a central office and an optical components at the user's premises by using passive element, such as optical power splitter.

In Japan, there has been currently introduced an economic optical access communication system GE-PON (Gigabit Ethernet (registered trademark)-PON) that shares a throughput of 1 Gb/s level among up to 32 users, by time division multiplexing (TDM).

As a next-generation optical access system that can meet the need for further capacity enlargement, the research and development of a 10 G-EPON of the 10 Gb/s level have been advanced, and this system is a system that can enlarge the capacity by an increase in bit rate of an optical transceiver, while using the same transmission path part as that in the existing GE-PON.

On the other hand, it is considered that capacity enlargement exceeding the 10 Gb/s level is required depending on the services such as a high-definition video service, but further speedup (40 or 100 Gb/s level) in bit rate of a transceiver involves a significant cost increase of the transceiver, and a practical system cannot be obtained, which has been a problem.

As a means for realizing economic capacity enlargement, there is reported a wavelength-variable-type WDM/TDM-PON obtained by giving wavelength variability to an optical transceiver so that an optical transceiver in an equipment at a central office can be gradually added according to a bandwidth requirement, and combining the TDM and wavelength division multiplexing (WDM) (for example, refer to Non Patent Literature 1).

CITATION LIST

Non Patent Literature

Non Patent Literature 1: S. Kimura, "WDM/TDM-PON Technologies for Future Flexible Optical Access Networks", 15th OECC 2010, 6A1-1.

The standardization of such a system is currently advanced as a 40 Gb/s level NG-PON2 (ITU-T G. 989 series) in ITU-T and FSAN, and the NG-PON2 is a system that economically realizes the 40 Gb/s level by performing the WDM of devices with the 10 Gb/s level that have different wavelengths, using 4 wavelengths. At the current moment, as a wavelength band for upstream signals, 1524-1544 nm is discussed as a strong candidate, considering required conditions such as coexistence with existing systems.

On the other hand, in PON systems, such as the IEEE GE-PON and the 10 G-EPON, and the ITU-T G-PON and the XG-PON, a band of around 1300 nm is used as a wavelength band for upstream signals, and an inexpensive direct modulated laser diode (DML) without temperature control can be applied as a light source for upstream signals. It is well known that DML has a significant disadvantage of extensive waveform distortion due to the wavelength dispersion if the DML is operated at a wavelength band in which chromatic dispersion of an optical fiber exists. This is because an optical intensity modulated signal is generated by driving the LD bias current, and which results in optical spectrum broadening. However because the wavelength dispersion of an optical fiber is almost zero at a wavelength around 1300 nm, a transmission distance of 20 km or more can be realized, so the DML is advantageous in this point.

Furthermore, the DML also has such a feature that burst signal generation can be performed only by controlling the LD driving current. Nevertheless, because using 1524-1544 nm as an upstream wavelength band is regarded as a strong candidate in the NG-PON2, in the DML, a transmission distance of only about 10 km can be expected due to the influence of dispersion.

Furthermore, in the NG-PON2, in addition to the TDM according to the related art, a WDM technique with the number of wavelengths being 4, and an optical frequency interval of about 100 GHz (wavelength interval of about 0.8 nm) (WDM/TDM-PON method) is used. However, in a direct modulated LD without a temperature control device (TEC: Thermo Electric Cooler), an emission wavelength of the DML varies at the rate of about 0.1 nm/° C. according to a change in case temperature of a transceiver.

Thus, because an emission wavelength varies depending on the temperature of an environment in which the transceiver is installed, there is fear that large wavelength inter-channel cross talk occurs. It is therefore inadvisable to apply a DML without the TEC or any temperature stabilization element (or temperature stabilization mechanism), to the NG-PON2.

It is accordingly necessary to introduce, into the NG-PON2, an upstream signal transmitter of an external modulation type that is difficult to be influenced by dispersion, and having a constant emission wavelength independently of a case temperature. As an external modulation type light source, an EML (EAM integrated-DFB-LD) that is obtained by monolithically-integrated (integrating into one chip) an electro absorption modulator (EAM) and a distributed feedback-laser diode (LD) (DFB-LD) is promising in terms of downsizing and cost saving. Because an EML-transmitter optical sub assembly (EML-TOSA) has been developed for a WDM network, the EML-TOSA is generally composed of an EML chip, a TEC for temperature control, and other components, so a shift in emission wavelength does not occur even if the case temperature of the transceiver varies, because the temperature is kept constant (e.g., at 45° C.) by a temperature control mechanism.

FIG. 1 illustrates a configuration of an external modulation type burst signal optical transmitter using an EML-transmitter optical sub assembly (EML-TOSA) 22 according to the related art, and a transceiver 1 includes the EML-TOSA 22, an EAM driving circuit 24, and a burst-mode LD driving circuit 31. The EML-TOSA 22 includes a DFB-LD 13 and an EAM 23. In addition, the EAM 23 is monolithically-integrated into the DFB-LD 13, and is also referred to as an EML. In FIG. 1, illustration is given while focusing attention only on a transmission unit of the transceiver 1 equipped in an ONU (receiver and other peripheral circuits are omitted).

FIG. 2 illustrates a burst control circuit unit in the external modulation type burst signal optical transmitter according to the related art that is illustrated in FIG. 1, and the burst control circuit unit includes the DFB-LD 13, the burst-mode LD driving circuit 31, an electrode 37, and a ground electrode 38, and bias current ($I_b$) 61 flows in each of connected circuits, according to the direction of an arrow in FIG. 2.

In FIG. 2, illustration is given while focusing attention only on the burst-mode LD driving circuit 31 connected to the DFB-LD 13 in the EML-TOSA 22, and the periphery thereof, in the external modulation type burst signal optical transmitter according to the related art that is illustrated in FIG. 1, and the EA modulator (EAM) 23, the EAM driving circuit 24, and the periphery thereof are omitted. A time chart in a burst signal control method for the external modulation type burst signal optical transmitter according to the related art that is illustrated in FIG. 1 is illustrated in FIG. 3.

In FIG. 1, the external modulation type burst signal optical transmitter according to the related art mainly includes the EML-TGSA 22, the burst-mode LD driving circuit 31, and the EAM driving circuit 24. Burst signal light 10 transmitted from the transceiver 1 is generated in the following manner. Transmission signal data 5 transmitted from a higher layer (not illustrated) of the transceiver 1 includes idle signals 52 and data signals 51 (refer to FIG. 3).

In addition, a burst control signal 6 similarly transmitted from a higher layer (not illustrated) generates the burst signal light 10 by controlling On/Off of the burst-mode LD driving circuit 31 according to a transmission permissible time allocated to the ONU. The value of the bias current ($I_b$) 61 (refer to FIGS. 1 and 3) supplied from the burst-mode LD driving circuit 31 to the DFB-LD 13 included in the EML-TOSA 22, via a LD bias line 25 is set according to the On/Off of the burst control signal 6.

In addition, the set bias current 61 is a constant current value, and is 80 mA/0 mA during On/Off in the related art illustrated in FIG. 3. In other words, when the burst control signal 6 is turned Off, the LD drive current (bias current 61) is set to 0 mA, and an optical signal is not transmitted. In addition, when the burst control signal 6 is turned On, continuous light having corresponding optical intensity to the bias current 61 of 80 mA is emitted from the DFB-LD 13, and enters the monolithically-integrated FAN 23.

On the other hand, the transmission signal data 5 transmitted from the higher layer (not illustrated) of the transceiver 1 includes the data signals 51 and the idle signals 52 (refer to FIG. 3), and is input to the EAM driving circuit 24, and EAM bias voltage ($V_b$) 72 (refer to FIG. 3) and EAM modulation voltage amplitude ($V_{pp}$) 73 (refer to FIG. 3) are generated from the EAM driving circuit 44, and input to the EAM 23 via an EAM signal line 27. Thus, the intensity of continuous light that has entered the EAM 23 is modulated by the EAM 23, and is converted into the burst signal light 10 (a data optical signal 101).

In the above-described manner, when the burst control signal 6 is turned On, the burst signal light 10 (data optical signal 101) is transmitted from the transceiver 1, and when the burst control signal 6 is turned Off, the burst signal light 10 (data optical signal 101) is not transmitted. Here, in the related art illustrated in FIG. 1, −1 V and 2 V are set as the EAM bias voltage ($V_b$) 72 (refer to FIG. 3) and the EAM modulation voltage amplitude ($V_{pp}$) 73 (refer to FIG. 3), respectively.

Nevertheless, if burst driving of the EML-TOSA 22 is performed in this manner, the following serious problem is generated. There has been generally known a method of adding a bypass capacitor to a pathway in which DC current or voltage flows, and removing fluctuation in current or voltage of a certain frequency component or more, for suppressing characteristic degradation caused by the noise generated in an optical component.

Also in the EML-TOSA 22, similarly, for removing a noise component entering the bias current ($I_b$) 61, a bypass capacitor ($C_{bp}$) 14 is sometimes used in parallel with the DFB-LD 13 as illustrated in FIG. 4. With such a circuit configuration, the bypass capacitor ($C_{bp}$) 14 can block a noise component caused by a high-frequency voltage component (i.e., the EAM modulation voltage amplitude ($V_{pp}$) 73) having large amplitude that is to be applied to the EAM 23 existing in immediate proximity (adjacent with a distance of 50 μm or less) to the DFB-LD 13 leaking into the bias current ($I_b$) 61 to be applied to the DFB-LD 13.

By using the bypass capacitor ($C_{bp}$) 14, while such an advantage is obtained, the following serious problem is caused. FIG. 5 illustrates a time chart in a control method for an external modulator type burst signal optical transmitter in a case in which a burst control circuit illustrated in FIG. 4 is used. If the burst control signal 6 illustrated in FIG. 5 is input to the burst-mode LD driving circuit 31 (refer to FIG. 4), because the bypass capacitor ($C_{bp}$) 14 is connected in series with the DFB-LD 13, from the burst-mode LD driving circuit 31, not only the bias current ($I_b$) 61 flows in the DFB-LD 13, but also bypass capacitor current ($I_c$) 62 flows in the bypass capacitor ($C_{bp}$) 14, for a time until the bypass capacitor is charged.

Thus, because the bias current ($I_b$) 61 is reduced by an amount corresponding to the bypass capacitor current ($I_c$) 62, for the time until the bypass capacitor is charged, rising becomes gradual as illustrated in FIG. 5. In this manner, if a transitional response of the bias current ($I_b$) 61 becomes gradual, as illustrated in FIG. 5, the rising of the data optical signal 101 in the burst signal light 10 similarly becomes gradual (a burst response time of the burst optical signal being 100 ps), and it takes time for burst signal On reaching sufficient optical intensity. There has been such a serious problem that, during a period in which the burst signal does not reach sufficient optical intensity, transmission between OLT/ONU does not work, and this leads to a decrease in bandwidth use efficiency.

SUMMARY OF INVENTION

Technical Problem

For solving the problem, the object of the present invention is to improve the slackening of the rising of a burst optical signal that is caused by a capacitor used for, for example, removing a noise, and by capacitance component underlying in a light source itself.

Solution to Problem

Specifically, a burst optical signal transmission device according to the present invention includes a light source for generating and outputting burst signal light, a light source driving circuit for outputting, to the light source, a driving signal for switching between an output time and a stop time of the burst signal light, based on a burst control signal, and a pre-emphasis circuit for outputting a pre-emphasis control signal for superimposing an additional signal for charging a capacitor included in the light source, onto a vicinity of a beginning of the driving signal.

The vicinity of the beginning of the driving signal may be a predetermined timing earlier than the beginning of the driving signal. The predetermined timing is a timing going back from the beginning of the driving signal, by a time required for charging the capacitor to a first predetermined rate. The predetermined timing is defined based on capacity of the capacitor, current to be flown into the capacitor, and voltage to be applied to the light source.

The burst optical signal transmission device according to the present invention may further include a current supplying unit for supplying, to the light source, such current as to cause charging of the capacitor to fall within a range being smaller than a second predetermined rate being lower than the first predetermined rate.

In the burst optical signal transmission device according to the present invention, the capacitor includes a bypass capacitor arranged in parallel with the light source or a parasitic capacitor underlying in the light source, or the bypass capacitor and the parasitic capacitor.

Specifically, a burst optical signal transmission method according to the present invention is a burst optical signal transmission method executed by a burst optical signal transmission device for generating and outputting burst signal light using a light source, and when a light source driving circuit outputs, to the light source, a driving signal for switching between an output time and a stop time of the burst signal light, based on a burst control signal, a pre-emphasis circuit outputs a pre-emphasis control signal for superimposing an additional signal for charging a capacitor included in the light source, onto a vicinity of a beginning of the driving signal.

In addition, the above-described inventions can be combined wherever possible.

Advantageous Effects of Invention

As described above, with use of the technique of the present invention, external modulator type burst optical signal transmission with a fast burst rising time that can perform, even in the C-band, long-distance transmission of 20 km or more that has less distortion of an optical signal waveform caused by wavelength dispersion, and does not cause a transmission error even at a burst signal transmission start can be realized.

DESCRIPTION OF EMBODIMENTS

Embodiments of the present invention will be described in detail below with reference to the drawings. In addition, the present invention is not limited to the following embodiments. These examples of the execution are mere exemplifications, and the present invention can be executed in a configuration in which various modifications and improvements have been made based on the knowledge of the one skilled in the art. In addition, in the specification and the drawings, constituent elements having the same signs indicate mutually same components.

First Embodiment of Invention

Figure 6:
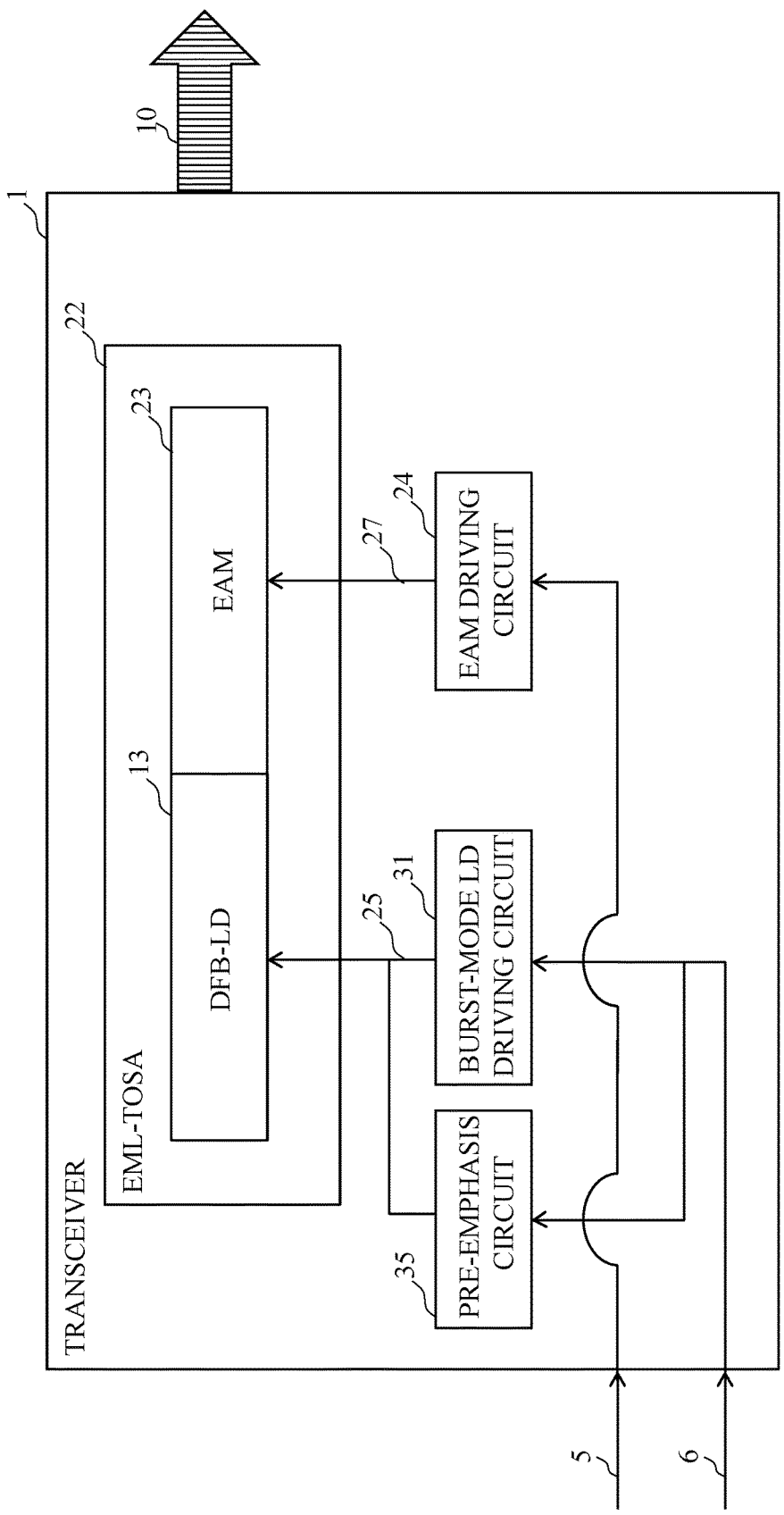
FIG. 6 illustrates a configuration diagram of an external modulation type burst signal optical transmitter according to the present embodiment.

A control method for a 10 Gb/s level external modulator type burst optical signal transmitter according to a first embodiment of the present invention will be described in detail below based on FIGS. 6 to 8. FIG. 6 illustrates a configuration of a transceiver 1 in the 10 Gb/s level external modulator type burst signal optical transmitter being the first embodiment of the present invention. The transceiver 1 outputting burst signal light 10 includes an EML-TOSA 22, an EAM driving circuit 24, a burst-mode LD driving circuit 31, and a pre-emphasis circuit 35, and the EML-TOSA 22 includes a DFB-LD 13 and an EAM 23. Here, the transceiver 1 may function as a burst optical signal transmission device, the burst-mode LD driving circuit 31 may function as a light source driving circuit, and the DFB-LD 13 may function as a light source.

Transmission signal data 5 input from the outside is received by the EAM driving circuit 24, and output to the EAM 23 via an EAM signal line, and a burst control signal 6 is received by the burst-mode LD driving circuit 31 and the pre-emphasis circuit 35, and output to the DFB-LD 13 via a LD bias line 25. In addition, illustration is given while focusing attention only on a transmission unit of the transceiver 1 equipped in an GNU (receiver unit and other peripheral circuits are omitted).

Figure 1:
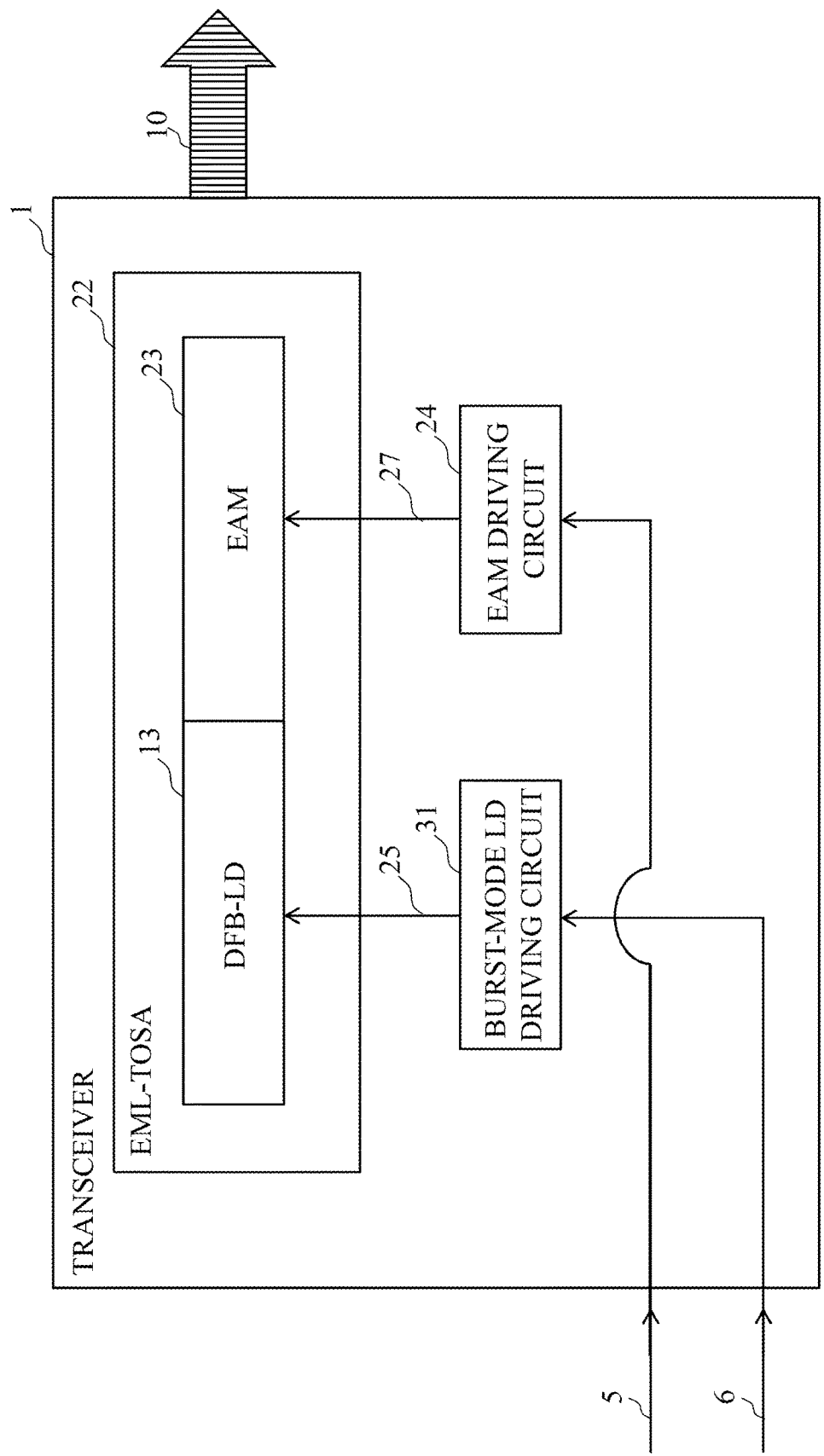
FIG. 1 illustrates a configuration diagram of an external modulation type burst signal optical transmitter according to a related art.
Figure 2:
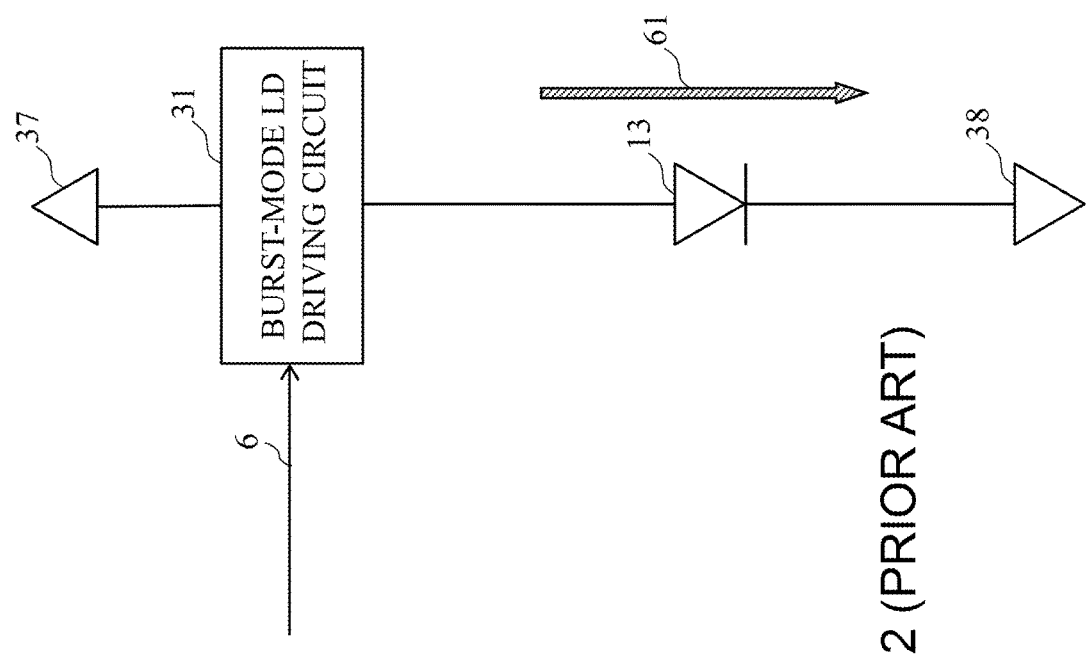
FIG. 2 illustrates a configuration diagram of a burst control circuit in an external modulation type burst signal optical transmitter according to a first related art.
Figure 3:
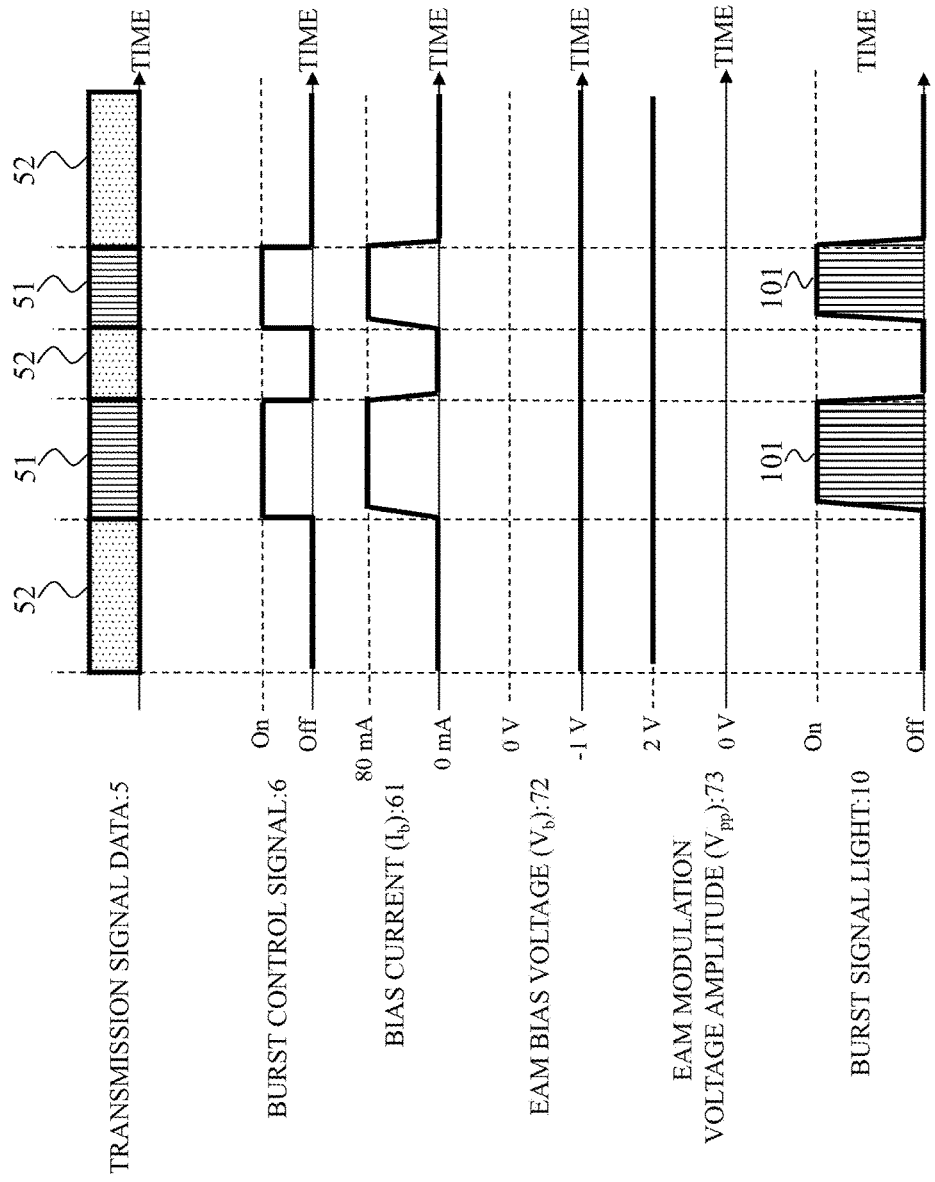
FIG. 3 illustrates a time chart in a control method for the external modulation type burst signal optical transmitter according to the first related art.
Figure 4:
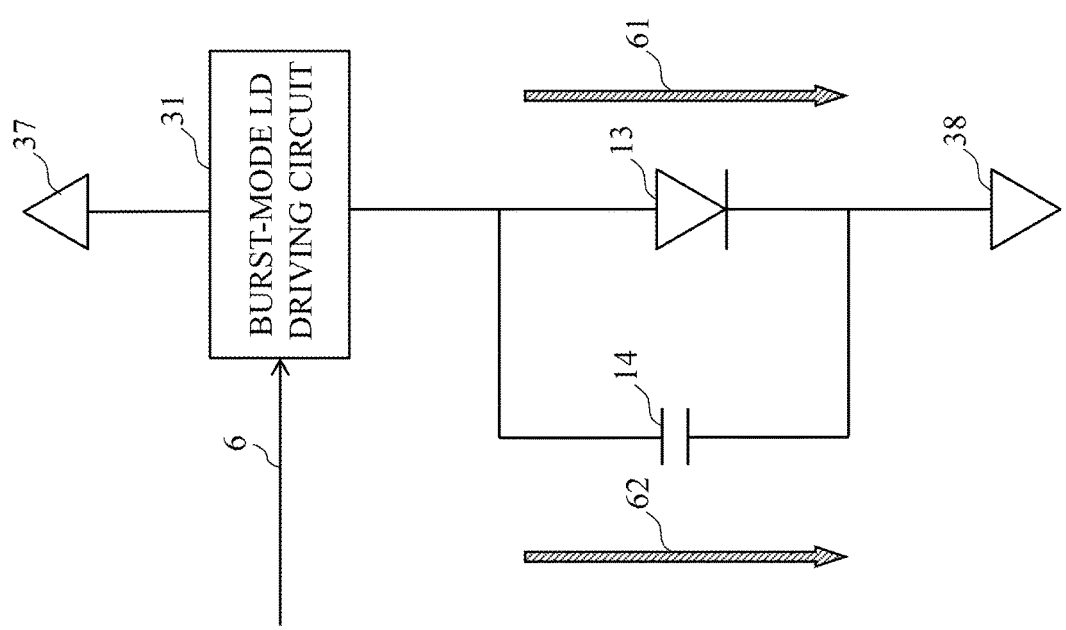
FIG. 4 illustrates a burst control circuit in an external modulation type burst signal optical transmitter according to a second related art.
Figure 5:
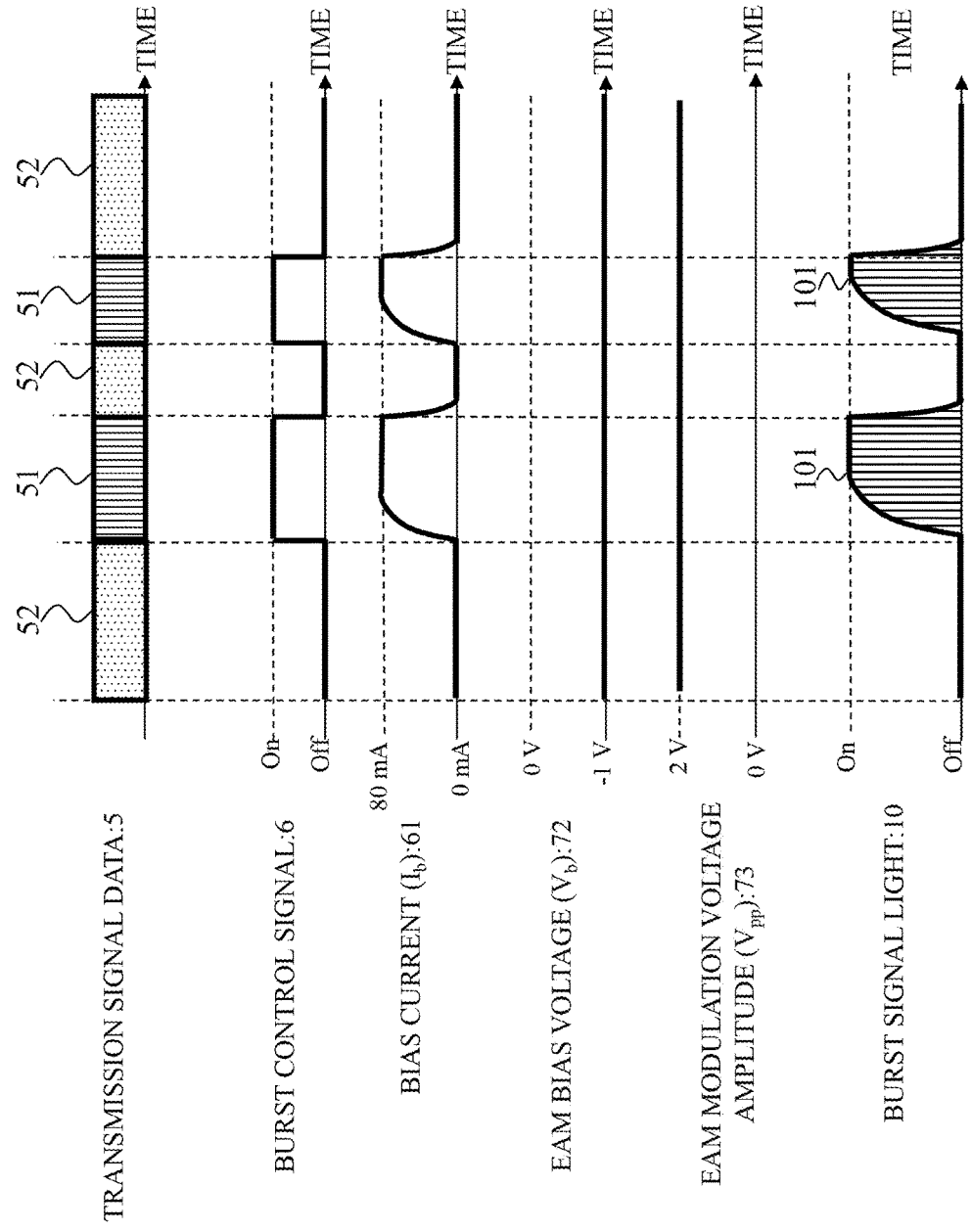
FIG. 5 illustrates a time chart in a control method for the external modulation type burst signal optical transmitter according to the second related art.
Figure 7:
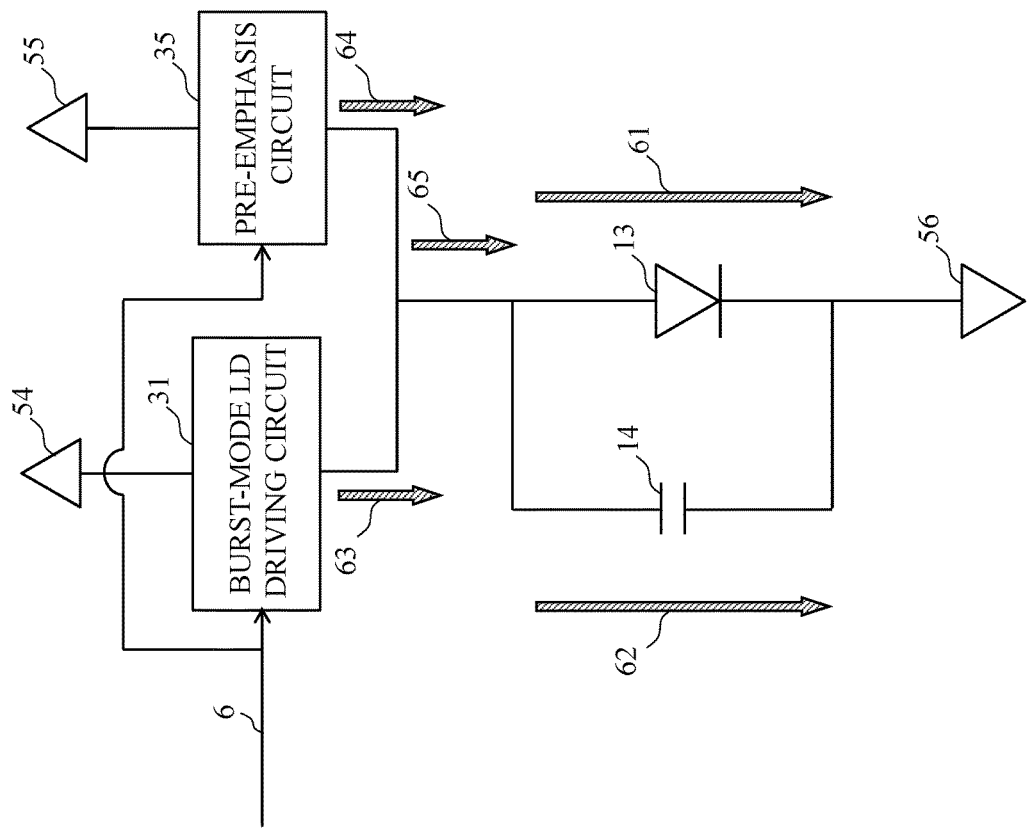
FIG. 7 illustrates a first configuration diagram of a burst control circuit in the external modulation type burst signal optical transmitter according to the present embodiment.

In addition, FIG. 7 illustrates a burst control circuit in the present embodiment. The burst control circuit includes the DFB-LD 13, a bypass capacitor 14, the burst-mode LD driving circuit 31, the pre-emphasis circuit 35, an electrode #1-54, an electrode #2-55, and a ground electrode 56. As illustrated in FIG. 4, the bypass capacitor 14 has a function of removing a noise component entering bias current (Ib) 61. In FIG. 7 the bypass capacitor 14 functions as a capacitor included in a light source.

Figure 8:
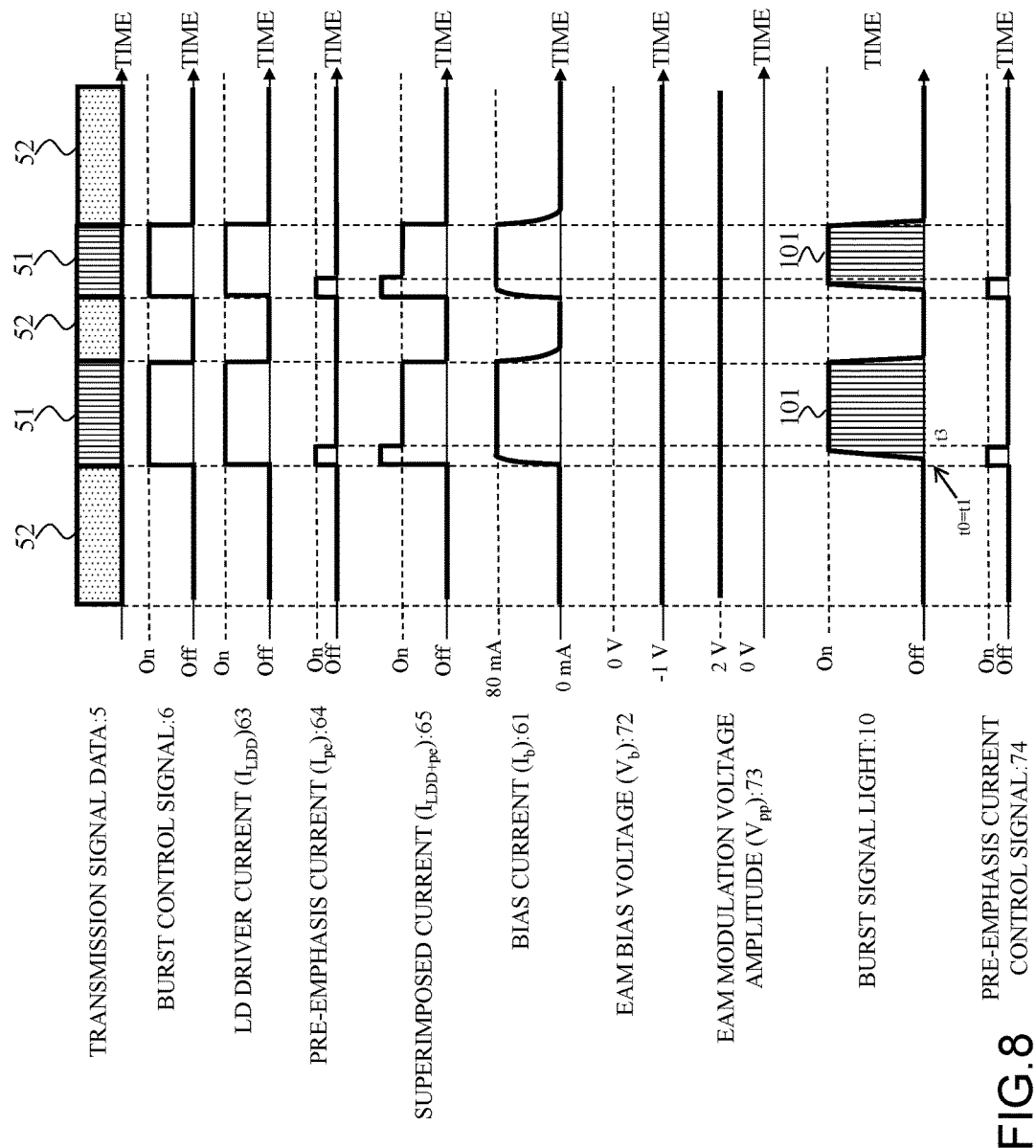
FIG. 8 illustrates a time chart in a control method for an external modulation type burst signal optical transmitter according to a first embodiment.

FIG. 8 illustrates a time chart in the present embodiment. In FIG. 6, the transmission unit mainly includes the EML-TOSA 22 including the EML (the DFB-LD 13 and the EAM 23), the burst-mode LD driving circuit 31, the pre-emphasis circuit 35, and the EAM driving circuit 24.

Burst signal light 10 transmitted from the transceiver 1 is generated in the following manner. The transmission signal data 5 having a signal speed of the 10 Gb/s level that has been transmitted from a higher layer (not illustrated) of the transceiver 1 includes idle signals 52 and data signals 51, and the data signals 51 are upstream signals to be transmitted by the transceiver 1 for the GNU, toward an OLT, and the transmission timing of the data signals 51 is controlled by the On/Off control of the burst control signal 6 (refer to FIG. 8). Here, the burst control signal 6 is input to the burst-mode LD driving circuit 31 and the pre-emphasis circuit 35.

As illustrated in FIG. 7, from the burst-mode LD driving circuit 31, according to the On/Off of the burst control signal 6, LD driver current 63 is output during On. In addition, similarly, from the pre-emphasis circuit 35, according to the On/Off of the burst control signal 6, pre-emphasis current ($I_{pe}$) 64 is output during On. In addition, the pre-emphasis circuit 35 may output a pre-emphasis control signal for superimposing an additional signal for charging the capacitor, on a driving signal, as the pre-emphasis current ($I_{pe}$) 64, at the vicinity of the beginning of the burst control signal 6, or at a timing earlier than the beginning.

Thus, by the pre-emphasis current ($I_{pe}$) 64 being superimposed on the LD driver current ($I_{LDD}$) 63, resultant current is applied as superimposed current ($I_{LDD+pe}$) 65 to the DFB-LD 13 via the LD bias line 25. Output light emitted from the DFB-LD 13 is converted by the EAM 23 into a modulation signal, and transmitted by the transceiver 1 as the burst signal light 10.

Here, the pre-emphasis current ($I_{pe}$) 64 output from the pre-emphasis circuit 35, which serves as the most characteristic feature of the present embodiment, is additionally applied for a time until the bypass capacitor ($C_{bp}$) 14 is charged, as illustrated in FIG. 8, for supplementing a deficient amount generated by bypass capacitor current ($I_c$) 62 flowing for the time until the bypass capacitor ($C_{bp}$) 14 is charged.

Here, if a rising start time of the LD driver current 63 is denoted by t0, a rising start time of the pre-emphasis current 64 is denoted by t1, and a falling start time of the pre-emphasis current 64 is denoted by t3, in the present embodiment, t0 is set to an arbitrary value, and the values are set so that t1=t0, t3=t0+30 ps are satisfied. In other words, a time for which the pre-emphasis current flows is 30 ps. In addition, the pre-emphasis current 64 flowing when the burst control signal 6 is turned On/Off is assumed to be 30 mA/0 mA.

The time for which the pre-emphasis current 64 flows is a time until the bypass capacitor 14 is charged, and is not limited to 30 ps. The time for which the pre-emphasis current 64 flows is not limited to a time required for charging 100% of load capability $C_p$, and an arbitrary rate can be used. For example, a first predetermined rate of the load capability $C_p$ can be an arbitrary rate being, for example, equal to or larger than 50% and equal to or smaller than 100%, and is preferably a rate being equal to or larger than 75% and equal to or smaller than 95%, in terms of the shortening of a charging time of the pre-emphasis current 64.

When forward voltage in a transitional response process of the DFB-LD 13 is denoted by $V_f$, load capability of the bypass capacitor 14 is denoted by $C_p$, and bypass capacitor current 62 flowing to the bypass capacitor 14 is denoted by $I_{chg}$, a charging time $T_{chg}$ until the bypass capacitor 14 is charged can be represented by the following formula.

(Math. 1)

$$T_{chg}=(V_f \times C_p)/I_{chg} \qquad (1)$$

According to the above formula, if charging current $i_{chg}$ is increased, a charging time $t_{chg}$ becomes shorter. Thus, by increasing the charging current of the bypass capacitor 14 by injecting a pre-emphasis signal in a pulse manner, aside from the driving signal, the rising time can be speeded up.

In this manner, as illustrated in FIG. 8, a transitional response of the bias current ($I_b$) 61 has been speeded up by the pre-emphasis current ($I_{pe}$) 64 output from the pre-emphasis circuit 35, and a burst rising time of the burst signal light 10 (burst response time of the data optical signal 101) has also been improved to 50 ps.

Figure 10:
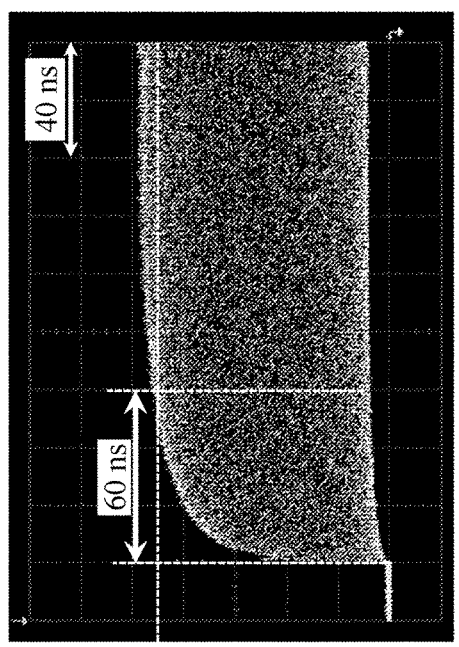
FIG. 10 illustrates an example of an evaluation result of a rising time of a burst optical signal according to a comparative example.
Figure 11:
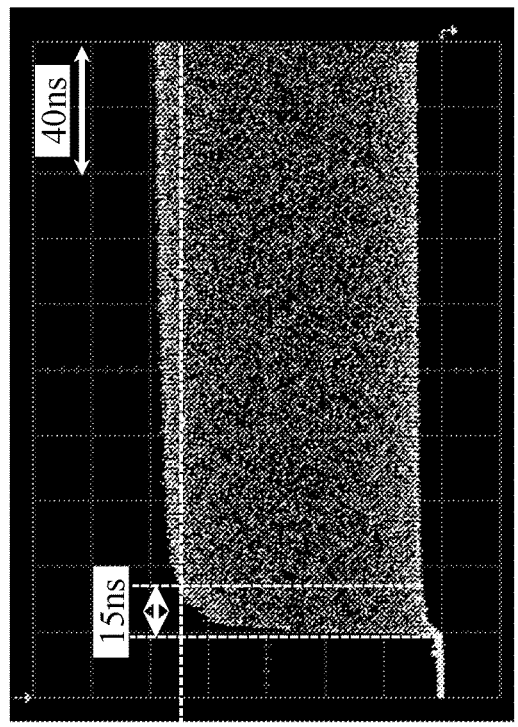
FIG. 11 illustrates an example of an evaluation result of a rising time of a burst optical signal according to an example.

FIGS. 10 and 11 illustrate specific evaluation results of the rising time of the burst optical signal. FIG. 10 illustrates a case in which the pre-emphasis circuit 35 does not flow the pre-emphasis current 64, and FIG. 11 illustrates a case in which the pre-emphasis circuit 35 flows the pre-emphasis current 64. The forward voltage $V_f$ in the transitional response process of the DFB-LD 13 is 0 to 2.5 V, the load capability $C_p$ of the bypass capacitor 14 is 100 pF, the bypass capacitor current $I_{chg}$ is 0 to 10 mA, and the pre-emphasis current 64 from the pre-emphasis circuit 35 is 20 mA. The EAM 23 has performed modulation at 10 Gbit/s.

While a burst optical signal rising time illustrated in FIG. 10 is 60 ns, a burst optical signal rising time illustrated in FIG. 11 is 15 ns. In this manner, by flowing the pre-emphasis current 64, an effect of improving the burst rising time by 75% can be confirmed.

In addition, in the present embodiment, a modulation speed with the 10 G/bs level is used, but in the control method in the present embodiment, a modulation speed other than 10 Gb/s (for example, 1 Gb/s, 25 Gb/s, 40 Gb/s, equal to or larger than 40 Gb/s, or the like) can be applied to the modulation speed. In addition, in the present embodiment, an EML-type external modulation integrated-type light source is used, but it is apparent that a similar effect is obtained by using an external modulation integrated-type light source having a configuration in which a semiconductor Mach-Zehnder modulator (MZM) and the DFB-LD 13 are integrated.

In addition, the light source is not limited to the DFB-LD 13, and it is apparent that a similar effect is obtained by using a wavelength-tunable laser. Furthermore, it is apparent that the present invention can also be applied to an external modulator type light source having a configuration in which the BAN 23 or an MZM-type external modulator module (semiconductor MZM or LN modulator), and a DFB-LD module are separate modules, and these modules are connected by an optical connection means such as an optical fiber.

Figure 12:
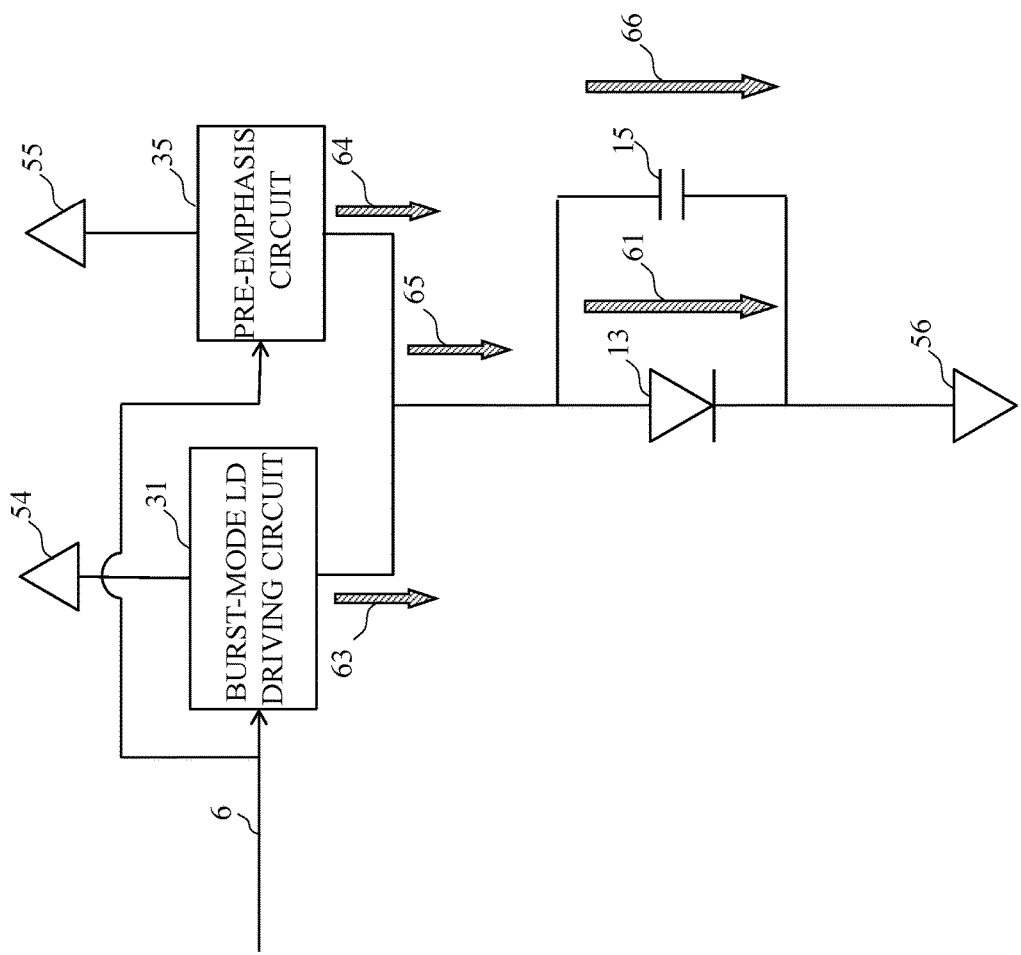
FIG. 12 illustrates a second configuration diagram of a burst control circuit in the external modulation type burst signal optical transmitter according to the present embodiment.
Figure 13:
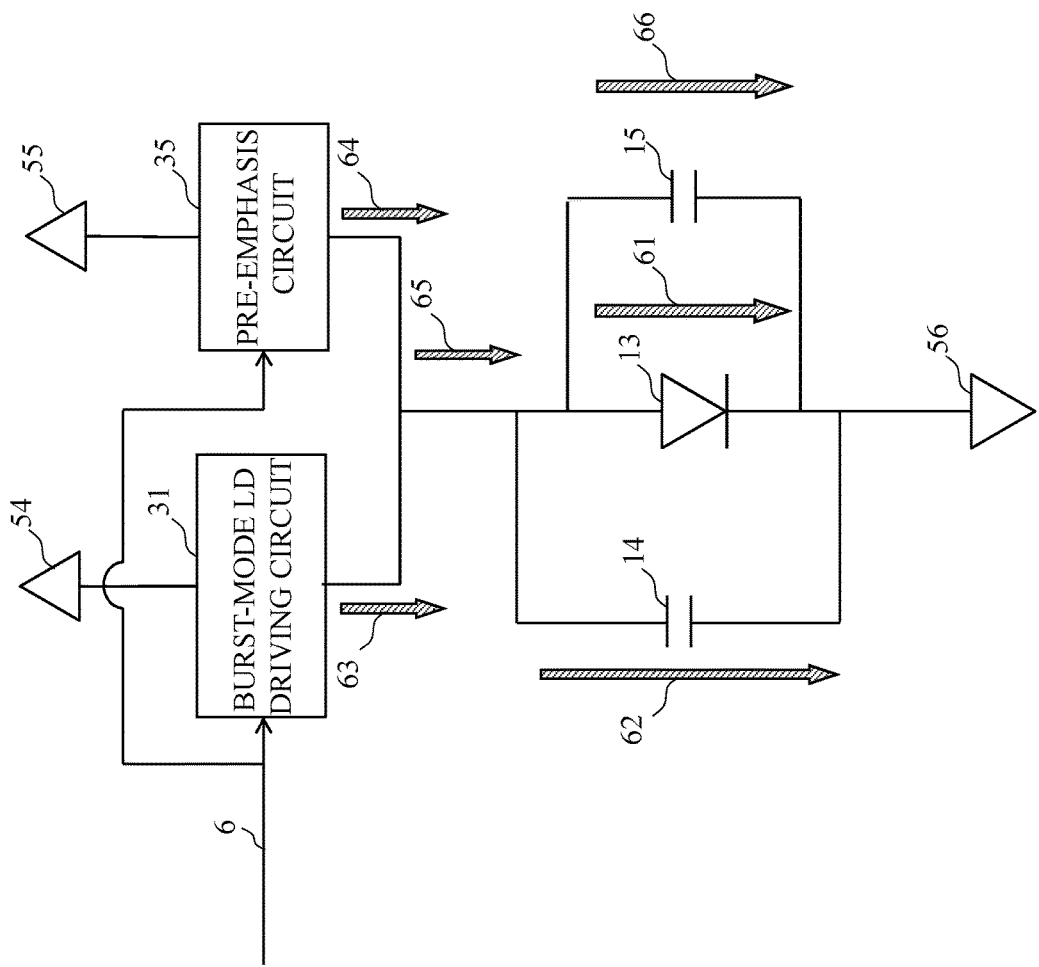
FIG. 13 illustrates a third configuration diagram of a burst control circuit in the external modulation type burst signal optical transmitter according to the present embodiment.

Based on the foregoing, the DFB-LD 13 functioning as a light source may include a parasitic capacitor underlying in the DFB-LD 13 in the process of manufacturing of the DFB-LD 13, as illustrated in FIGS. 12 and 13. The light source may be a distributed feedback-semiconductor laser, a distribution Bragg reflector-semiconductor laser, or a wavelength-variable laser. In addition, according to the present invention, in some cases, the bypass capacitor 14 is implemented in a light source (FIG. 7). Alternatively, in some cases, there is a parasitic capacitor 15 underlying in the light source (FIG. 12). Alternatively, in some cases, there is the parasitic capacitor 15 underlying in the light source, and the bypass capacitor 14 is implemented (FIG. 13). According to the present invention, in these cases, by applying pre-emphasis current at the same timing as a burst control signal, or at a timing earlier than the burst control signal, the rising of the burst optical signal can be improved.

FIG. 12 illustrates an equivalent circuit in a case in which a parasitic capacitor is included in the DFB-LD 13. In the configuration illustrated in FIG. 12, instead of the bypass capacitor current (Ic) 62 flowing in the bypass capacitor 14, parasitic capacitor current 66 flows in the parasitic capacitor 15. In the case of a burst optical signal transmission device adopting the configuration illustrated in FIG. 12, in the embodiment described with reference to FIG. 7, the capacitor capacity of the parasitic capacitor 15 is read instead of the capacitor capacity of the bypass capacitor 14, and the parasitic capacitor current 66 is read instead of the bypass capacitor current (Ic) 62. The burst optical signal transmission device adopting the configuration illustrated in FIG. 12 can be thereby executed.

FIG. 13 illustrates an equivalent circuit in a case in which the bypass capacitor 14 is included, and a parasitic capacitor is further included in the DFB-LD 13. In the configuration illustrated in FIG. 13, the bypass capacitor current (Ic) 62 flows in the bypass capacitor 14, and furthermore, the parasitic capacitor current 66 flows in the parasitic capacitor 15. In the case of a burst optical signal transmission device adopting the configuration illustrated in FIG. 13, in the embodiment described with reference to FIG. 7, the combined value of capacitor capacities of the bypass capacitor 14 and the parasitic capacitor 15 is read instead of the capacitor capacity of the bypass capacitor 14, and the bypass capacitor current (Ic) 62 and the parasitic capacitor current 66 are read instead of the bypass capacitor current (Ic) 62. The burst optical signal transmission device adopting the configuration illustrated in FIG. 13 can be thereby executed.

In addition, the transceiver 1 according to the present embodiment may be applied not only to an ONU, but also to an OLT. In addition, the transceiver 1 can be used in a transmission device for arbitrary optical packet switching (OPS) that transmits a burst optical signal, and the like.

Second Embodiment of Invention

A control method for a 10 Gb/s level external modulator type burst optical signal transmitter being a second embodiment of the present invention will be described in detail below based on FIGS. 6 to 7, and 9. FIG. 6 illustrates a configuration of the 10 Gb/s level external modulator type burst signal optical transmitter being the second embodiment of the present invention, and illustration is given while focusing attention only on a transmission unit of a transceiver 1 equipped in an ONU (receiver unit and other peripheral circuits are omitted).

Figure 9:
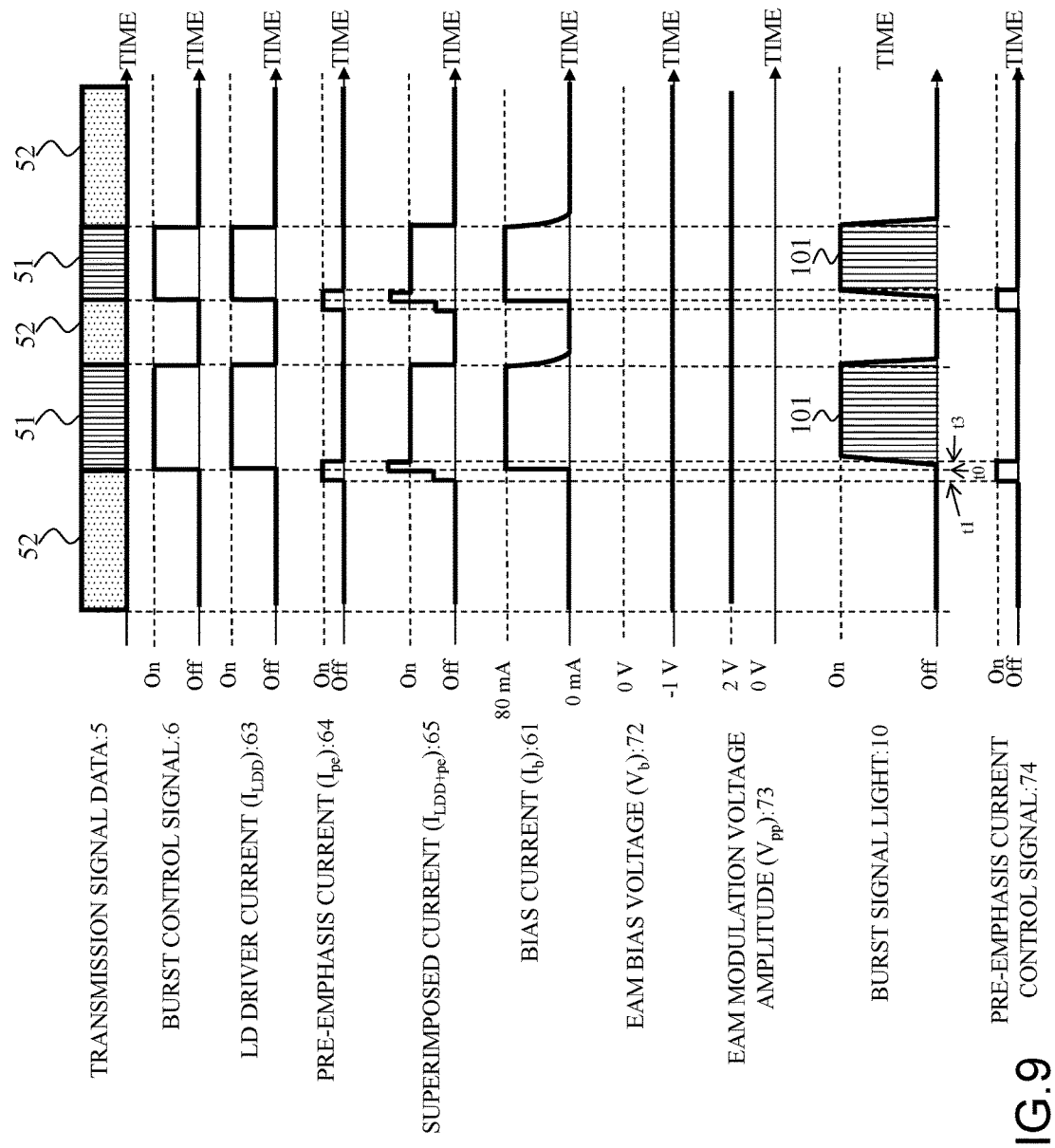
FIG. 9 illustrates a time chart in a control method for an external modulation type burst signal optical transmitter according to a second embodiment.

In addition, FIG. 7 illustrates a burst control circuit in the present embodiment, and FIG. 9 illustrates a time chart in the present embodiment. In FIG. 6, the transmission unit mainly includes the EML-TOSA 22 including the EML (the DFB-LD 13 and the EAM 23), the burst-mode LD driving circuit 31, the pre-emphasis circuit 35, and the EAM driving circuit 24.

Burst signal light 10 transmitted from the transceiver 1 is generated in the following manner. Transmission signal data 5 having a signal speed of the 10 Gb/s level that has been transmitted from a higher layer (not illustrated) of the transceiver 1 includes idle signals 52 and data signals 51, and the data signals 51 are upstream signals to be transmitted by the transceiver 1 for the ONU, toward an OLT, and the transmission timing of the data signals 51 is controlled by the On/Off control of the burst control signal 6 (refer to FIG. 9). Here, the burst control signal 6 is input to the burst-mode LD driving circuit 31 and the pre-emphasis circuit 35.

As illustrated in FIG. 7, from the burst-mode LD driving circuit 31, according to the On/Off of the burst control signal 6, LD driver current ($I_{LDD}$) 63 is output during On. In addition, similarly, from the pre-emphasis circuit 35, according to the On/Off of the burst control signal 6, pre-emphasis current ($I_{pe}$) 64 is output during On.

Thus, by the pre-emphasis current ($I_{pe}$) 64 being superimposed on the LD driver current ($I_{LDD}$) 63, resultant current is applied as superimposed current ($I_{LDD+pe}$) 65 to the DFB-LD 13 via the LD bias line 25. Output light emitted from the DFB-LD 13 is converted by the EAM 23 into a modulation signal, and transmitted by the transceiver 1 as the burst signal light.

Here, the pre-emphasis current ($I_{pe}$) 64 output from the pre-emphasis circuit 35, which serves as a characteristic feature of the present embodiment, is additionally applied for a time until the bypass capacitor ($C_{bp}$) 14 is charged, as illustrated in FIG. 9, for supplementing a deficient amount generated by bypass capacitor current ($I_c$) 62 flowing for the time until the bypass capacitor ($C_{bp}$) 14 is charged.

Here, if a rising start time of the LD driver current 63 is denoted by t0, a rising start time of the pre-emphasis current 64 is denoted by t1, and a falling start time of the pre-emphasis current 64 is denoted by t3, in the present embodiment, t0 is set to an arbitrary value, and the values are set so that t1=t0−15 ps, t3=t0+15 ps are satisfied. In other words, the time for which the pre-emphasis current ($I_{pe}$) 64 flows is 30 ps, which is similar to the first embodiment, and the most characteristic feature of the present embodiment lies in that the rising start time t1 of the pre-emphasis current 64 is set to be earlier than the rising start time t0 of the LD driver current 63 (t1<t0). By providing an offset time between the t0 and the t1 in this manner, a burst response of the bias current (Ib) 61 has been significantly improved, and a burst rising time of the burst signal light 10 (burst response time of the data optical signal 101) has been improved to 20 ps.

The offset time provided for the pre-emphasis current 64 is a predetermined timing earlier than the beginning of the driving signal, and is not limited to 15 ps. For example, the charging time $T_{chg}$ of the bypass capacitor 14 can be represented by Formula (1). Thus, the predetermined timing is defined based on the load capability $C_p$ of the bypass capacitor 14, the charging current $I_{chg}$ to the bypass capacitor 14, and the forward voltage $V_f$ of the DFB-LD 13. The time for which the pre-emphasis current 64 flows is not limited to a time required for charging 100% of load capability $C_p$, and an arbitrary rate can be used.

Third Embodiment of Invention

A burst optical signal transmission device according to the present embodiment further includes a current supplying unit (not illustrated) for further shortening a charging time $t_{chg}$. The current supplying unit (not illustrated) may be included in a burst-mode LD driving circuit 31 or a pre-emphasis circuit 35.

The current supplying unit (not illustrated) supplies, to a DFB-LD 13, such arbitrary current as to fall within a range being smaller than a second predetermined rate being lower than the first predetermined rate of the load capability $C_p$ that has been described in the first embodiment of the present invention. For example, the second predetermined rate of the load capability $C_p$ is an arbitrary rate being, for example, equal to or larger than 0% and smaller than 50%.

The current to be supplied by the current supplying unit (not illustrated) is preferably current with such an extent that the DFB-LD 13 does not emit light. Thus, the second predetermined rate is preferably smaller than the rate of the load capability $C_p$ charged in the bypass capacitor 14 when threshold current of the DFB-LD 13 is supplied to the DFB-LD 13.

In addition, in the present embodiment, a modulation speed with the 10 G/bs level is used, but in the control method in the present embodiment, a modulation speed other than 10 Gb/s (for example, 1 Gb/s, 25 Gb/s, 40 Gb/s, equal to or larger than 40 Gb/s, or the like) can be applied to the modulation speed. In addition, in the present embodiment, an EML-type external modulation integrated-type light source is used, but it is apparent that a similar effect is obtained by using an external modulation integrated-type light source having a configuration in which a semiconductor Mach-Zehnder modulator (MZM) and the DFB-LD 13 are integrated.

In addition, the light source is not limited to the DFB-LD 13, and it is apparent that a similar effect is obtained by using a wavelength-variable laser. Furthermore, it is apparent that the present invention can also be applied to an external modulator type light source having a configuration in which the ETON 23 or an MZM-type external modulator module (semiconductor MZM or LN modulator), and a DFB-LD module are separate modules, and these modules are connected by an optical connection means such as an optical fiber. Based on the foregoing, the light source may include an external modulator, and the external modulator may be an electro absorption semiconductor modulator, a semiconductor Mach-Zehnder modulator, or a lithium niobate modulator.

As the light source, the present invention can be applied to an arbitrary light source such as a solid-state laser, in addition to a DFB laser and a surface-emitting laser.

As described above, by using the technique of the present invention, an external modulator type burst optical signal transmission device with a fast burst rising time that can perform, even in the C-band, long-distance transmission of 20 km or more that has less distortion of an optical signal waveform caused by wavelength dispersion, and does not cause a transmission error even at a burst signal transmission start, and a control method for the same can be realized.

In addition, the value of the pre-emphasis current (Ipe) 64 is an arbitrary value. In addition, in the present embodiment, a light source using a current signal as a driving signal has been described, but the present invention can also be applied to a light source using a voltage signal as a driving signal. In this case, pre-emphasis voltage is used instead of pre-emphasis current.

INDUSTRIAL APPLICABILITY

The present invention can be applied to a communication information business.

REFERENCE SIGNS LIST

1: transceiver
5: transmission signal data
6: burst control signal
10: burst signal light
13: DFB-LD
14: bypass capacitor (Cbp)
15: parasitic capacitor
22: EML-TOSA
23: EAM
24: EAM driving circuit
25: LD bias line
27: EAM signal line
31: burst-mode LD driving circuit
35: pre-emphasis circuit
37: electrode
38: ground electrode
51: data signal
52: idle signal
54: electrode #1
55: electrode #2
56: ground electrode
61: bias current (Ib)
62: bypass capacitor current ($I_c$)
63: LD driver current ($I_{LDD}$)
64, 66: pre-emphasis current ($I_{pe}$)
65: superimposed current ($I_{LDD+pe}$)
72: EAM bias voltage ($V_b$)
73: EAM modulation voltage amplitude ($V_{pp}$)
74: pre-emphasis current control signal
101: data optical signal

What is claimed is:

1. A burst optical signal transmission device comprising:
a light source for generating and outputting burst signal light;
a light source driving circuit for outputting, to the light source, a driving signal for switching between an output time and a stop time of the burst signal light, based on a burst control signal; and
a pre-emphasis circuit for outputting a pre-emphasis control signal for superimposing an additional signal for charging a capacitor included in the light source and increasing current flowing into the light source, onto a vicinity of a beginning of the driving signal.

2. The burst optical signal transmission device according to claim 1, wherein the vicinity of the beginning of the driving signal is a predetermined timing earlier than the beginning of the driving signal.

3. The burst optical signal transmission device according to claim 2, wherein the predetermined timing is a timing going back from the beginning of the driving signal, by a time required for charging the capacitor to a first predetermined rate.

4. The burst optical signal transmission device according to claim 3, wherein the predetermined timing is defined based on capacity of the capacitor, current to be flown into the capacitor, and voltage to be applied to the light source.

5. The burst optical signal transmission device according to claim 4, further comprising a current supplying unit for supplying, to the light source, such current as to cause charging of the capacitor to fall within a range being smaller than a second predetermined rate being lower than the first predetermined rate.

6. The burst optical signal transmission device according to claim 4, wherein the capacitor includes a bypass capacitor arranged in parallel with the light source or a parasitic capacitor underlying in the light source, or the bypass capacitor and the parasitic capacitor.

7. A burst optical signal transmission method executed by a burst optical signal transmission device for generating and outputting burst signal light using a light source, the method comprising:
   a pre-emphasis circuit outputting, when a light source driving circuit outputs, to the light source, a driving signal for switching between an output time and a stop time of the burst signal light, based on a burst control signal, a pre-emphasis control signal for superimposing an additional signal for charging a capacitor included in the light source and increasing current flowing into the light source, onto a vicinity of a beginning of the driving signal.

8. The burst optical signal transmission device according to claim 1, further comprising a current supplying unit for supplying, to the light source, such current as to cause charging of the capacitor to fall within a range being smaller than a second predetermined rate being lower than the first predetermined rate.

9. The burst optical signal transmission device according to claim 1, wherein the capacitor includes a bypass capacitor arranged in parallel with the light source or a parasitic capacitor underlying in the light source, or the bypass capacitor and the parasitic capacitor.

10. The burst optical signal transmission device according to claim 2, further comprising a current supplying unit for supplying, to the light source, such current as to cause charging of the capacitor to fall within a range being smaller than a second predetermined rate being lower than the first predetermined rate.

11. The burst optical signal transmission device according to claim 2, wherein the capacitor includes a bypass capacitor arranged in parallel with the light source or a parasitic capacitor underlying in the light source, or the bypass capacitor and the parasitic capacitor.

12. The burst optical signal transmission device according to claim 3, further comprising a current supplying unit for supplying, to the light source, such current as to cause charging of the capacitor to fall within a range being smaller than a second predetermined rate being lower than the first predetermined rate.

13. The burst optical signal transmission device according to claim 3, wherein the capacitor includes a bypass capacitor arranged in parallel with the light source or a parasitic capacitor underlying in the light source, or the bypass capacitor and the parasitic capacitor.

* * * * *